(12) United States Patent  
Dimitrakopoulos et al.

(10) Patent No.: US 7,842,554 B2  
(45) Date of Patent: Nov. 30, 2010

(54) VLSI HOT-SPOT MINIMIZATION USING NANOTUBES

(75) Inventors: Christos Dimitrios Dimitrakopoulos, Baldwin Place, NY (US); Christos John Georgiou, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 12/169,458

(22) Filed: Jul. 8, 2008

(65) Prior Publication Data

US 2008/0316711 A1 Dec. 25, 2008

Related U.S. Application Data

(63) Continuation of application No. 11/397,033, filed on Mar. 29, 2006.

(51) Int. Cl.  
*H01L 21/00* (2006.01)

(52) U.S. Cl. ............... 438/122; 438/677; 257/E21.153; 257/E21.499

(58) Field of Classification Search ................. 438/677, 438/122; 257/E21.153, E21.499  
See application file for complete search history.

(56) References Cited

U.S. PATENT DOCUMENTS

| | | | |
|---|---|---|---|
| 5,424,054 A | 6/1995 | Bethune et al. | 423/447.3 |
| 5,897,945 A | 4/1999 | Lieber et al. | 428/323 |
| 6,346,189 B1 | 2/2002 | Dai et al. | 205/766 |
| RE38,223 E | 8/2003 | Keesmann et al. | 313/309 |
| 6,856,016 B2 | 2/2005 | Searls et al. | 257/720 |
| 6,864,571 B2 | 3/2005 | Arik et al. | 257/712 |
| 6,887,453 B2 | 5/2005 | Brorson et al. | 423/561.1 |
| 6,909,607 B2 | 6/2005 | Radosevich et al. | 361/699 |
| 6,923,946 B2 | 8/2005 | Geohegan et al. | 423/447.1 |

(Continued)

OTHER PUBLICATIONS

T. de los Arcos et al "Strong influence of buffer layer type om carbon nanotube characteristics" Carbon, vol. 42, No. 1 (2004) pp. 187-190.*

(Continued)

*Primary Examiner*—Caridad M Everhart  
(74) *Attorney, Agent, or Firm*—Robert J. Eichelburg; The Law Offices of Robert J. Eichelburg

(57) ABSTRACT

The invention relates to a semiconductive device comprising a die with at least one defined hot-spot area lying in a plane on the die and a cooling structure comprising nanotubes such as carbon nanotubes extending in a plane different than the plane of the hot-spot area and outwardly from the plane of the hot-spot area. The nanotubes are operatively associated with the hot-spot area to decrease any temperature gradient between the hot-spot area and at least one other area on the die defined by a temperature lower than the hot-spot area. A matrix material comprising a second heat conducting material substantially surrounds the nanotubes and is operatively associated with and in heat conducting relation with the other area on the die defined by a temperature lower than the hot-spot area. The heat conductivity of the nanotubes is greater than the heat conductivity of the matrix material, with the distal ends of the nanotubes exposed to present a distal surface comprising the first heat conducting means for direct contact with a medium comprising a cooling fluid. The inventors also disclose processes for manufacturing and using the device and products produced by the processes.

8 Claims, 1 Drawing Sheet

U.S. PATENT DOCUMENTS

| | | | | |
|---|---|---|---|---|
| 6,936,182 | B2 | 8/2005 | Rushford | 216/85 |
| 6,936,565 | B2 | 8/2005 | Ma et al. | 502/174 |
| 6,949,931 | B2 | 9/2005 | Cole et al. | 324/464 |
| 6,951,001 | B2 | 9/2005 | Chen | 716/5 |
| 6,955,937 | B1 | 10/2005 | Burke et al. | 438/53 |
| 6,979,244 | B2 | 12/2005 | Den et al. | 448/24 |
| 7,064,953 | B2* | 6/2006 | Miller | 361/690 |
| 7,494,910 | B2* | 2/2009 | Mouli et al. | 438/599 |
| 7,627,841 | B2* | 12/2009 | Shakouri et al. | 716/4 |
| 2002/0055196 | A1* | 5/2002 | Jaw et al. | 438/16 |
| 2005/0067693 | A1* | 3/2005 | Nihei et al. | 257/720 |
| 2005/0211427 | A1* | 9/2005 | Kenny et al. | 165/299 |
| 2005/0273208 | A1* | 12/2005 | Yazawa et al. | 700/299 |
| 2006/0090885 | A1* | 5/2006 | Montgomery et al. | 165/104.33 |
| 2006/0278901 | A1* | 12/2006 | Dangelo et al. | 257/276 |
| 2007/0155136 | A1* | 7/2007 | Chrysler et al. | 438/478 |
| 2007/0235847 | A1* | 10/2007 | Ramanathan et al. | 257/678 |
| 2008/0026493 | A1* | 1/2008 | Shakouri et al. | 438/17 |
| 2009/0085198 | A1* | 4/2009 | Vadakkanmaruveedu et al. | 257/714 |
| 2009/0102046 | A1* | 4/2009 | Dimitrakopoulos et al. | 257/712 |
| 2009/0288425 | A1* | 11/2009 | Phan et al. | 62/3.3 |

OTHER PUBLICATIONS

Wei-Chuan Fang et al "Superior electrochmical performance of CNx nanotues using TiSi2 buffer layre on Si substrates", J. of Vac. Sci. & Tech B(Jan. 2006) vol. 24, No. 1, pp. 87-90.*

Kuei-Yi et al . "Vertivally aligned growth of carbon nanotubes with long length and high density" J. Vac. Sci. & Tech. B (Jul. 2005), vol. 23, No. 4, pp. 1450-1453.*

T. de los Arcos et al Influence of iron-silicon interaction on the growth of carbon nanotubes produced by chemical vapor deposition: Applied Physics Letters (Apr. 1, 2002) vol. 80, No. 13, pp. 2383-2385.*

T. de los Arcos, et al "Strong influence of buffer layer type on carbon nanotube charateristics" Carbon (2004) vol. 42, No. 1, pp. 187-190.*

Mescia, N.C. et al. "Plant Automation in a Structured Distributed System Environment", *IBM J. Res. Develop.* vol. 26, No. 4, Jul. 1982.

Carre, H. et al. "Semiconductor Manufacturing Technology at IBM", *IBM J. Res. Develop.* vol. 26. No. 5, Sep. 1982.

Gao, et al., *J. Phys. Chem. B* 2000, 104, 1227-1234.

Fan, S. S. et al., "Self Oriented Regular Arrays of Carbon Nanotubes and Their Field Emission Properties" *Science*, vol. 283, pp. 512-514, (1999).

Chandra, Rajit "Automotive electronics need thermal-aware IC design" *Automotive Design Line*, (Jun. 13, 2005); http://www.automotivedesignline.com/GLOBAL/electronics/designline/shared/article/showArticle.jhtml?articled=164302553&pgno=1.

Hamann, H.F. et al. "Power Distribution Measurements of the Dual Core PowerPC™970MP Microprocessor," ISSCC Dig. Tech Papers, p. 534, Feb. 2006.

Mo, J. et al. "Integrated Nanotube Cooler for Microelectronic Applications," *Proceedings of the IEEE CPMT Conference on Electronics Components Technology (ECTC55 )*, May 30-Jun. 3, 2005, Orlando, USA, pp. 51-54.

* cited by examiner

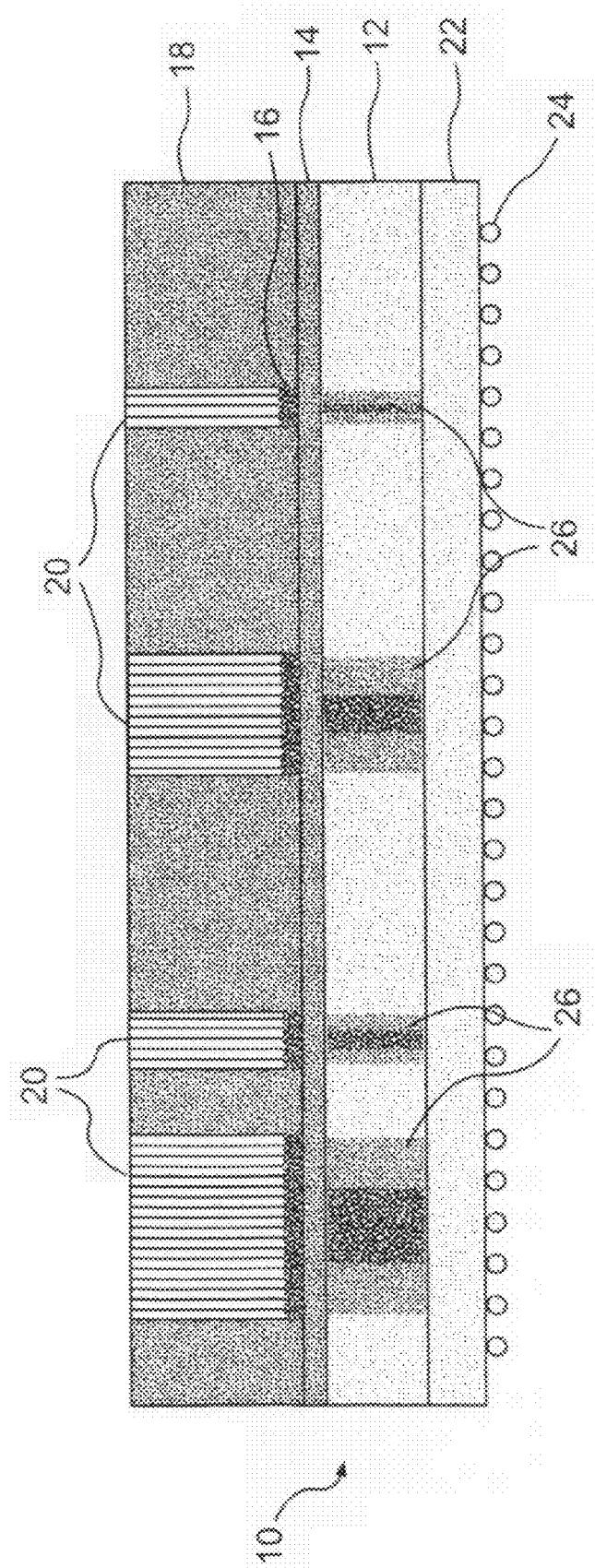

VLSI HOT-SPOT MINIMIZATION USING NANOTUBES

CROSS-REFERENCE TO RELATED APPLICATIONS

This application is a continuation application of parent application Ser. No. 11/397,033 Filed Mar. 29, 2006, the contents of which are incorporated in their entirety into this continuation application.

FIELD OF THE INVENTION

The field of the invention comprises nanotube cooling members incorporated into semiconductor devices, and very large scale integrated ("VLSI") semiconductor devices having high temperature areas or "hot-spots." The arrangement of the cooling members with other heat conductive materials minimizes or substantially eliminates thermal or temperature gradients between hot-spots and cooler areas on the device.

RELATED ART

The so-called "silicon revolution" spurred the development of faster and larger computers beginning in the early 1960's, with the industry predicting rapid growth because of the increasing numbers of transistors packed into integrated circuits, estimating transistors on integrated circuits would double every 2 years. Experience has shown that since 1975 the number of transistors on a semiconductor chip doubled about every 18 months.

The semiconductor industry experienced an extremely active period of innovation in the 1970's in the areas of circuit design, chip architecture, design aids, processes, tools, testing, manufacturing architecture and manufacturing discipline. The combination of these disciplines enabled the industry to enter into the VLSI era with the ability to mass-produce chips with 100,000 transistors per chip at the end of the 1980's after beginning the large scale Integration ("LSI") era in 1970 with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N. C. et al. "Plant Automation in a Structured Distributed System Environment", *IBM J. RES. DEVELOP.*, VOL. 26, no. 4, Jul. 1982).

Chen, U.S. Pat. No. 6,951,001, notes that continued scaling of the complementary metal oxide semiconductor ("CMOS") fabrication process increases the number of devices on a VLSI chip but causes "within-die" variations that can become significant problems such as $L_e$ (the effective channel Length) and $V_t$ (threshold voltage) as well as supply voltage and temperature variations. Within-die variations can also cause on-chip signal timing uncertainties. Conventional timing analysis for VLSI chips uses different values for process, voltage and temperature corners (maximum allowable combinations for these values) for maximum and minimum signal delay analysis. This approach often leads to "overdesigning," which may cause increasingly high power requirements and reliability problems. High power requirements can lead to overheating.

The introduction of IBM's Power6™ chip due in the middle of 2007, noted that "miniaturization has allowed chipmakers to make chips faster by cramming more transistors on a single slice of silicon, to the point where high-end processors have hundreds of millions of transistors. But the process also tends to make chips run hotter, and engineers have been trying to figure out how to keep shrinking chips down while avoiding them frying their own circuitry." (http://www.nytimes.com/reuters/technology/tech-ibm-power.html?pagewanted=print (Feb. 7, 2006))

Technology scaling of semiconductor devices to 90 nm and below has provided many benefits in the field of microelectronics, but has introduced new considerations as well. While smaller chip geometries result in higher levels of on-chip integration and performance, higher current and power densities, increased leakage currents, and low-k dielectrics with poorer heat conductivity occur that present new challenges to package and heat dissipation designs.

Sub-90 nm technologies also have to address on-die temperature variations as much as 50° C., or even higher in metal layers on the semiconductor chip since such severe temperature gradients can impact both performance and the reliability of the device, such as signal timing, clock skew, cross-talk noise, voltage drop, and median-time-to-failure of the device. (Chandra, Raj it, "Automotive electronics need thermal-aware IC design" *Automotive Design Line*, (Jun. 13, 2005); hftp://www.automotivedesigniine.com/GLOBAUelectronics/designiine/shared/articie/showArticle.jhtml?articled=164302553&pgno=1).

One approach that addresses on-chip hot-spots involves a temperature aware design methodology for identifying potential problem areas, and using this input during the physical design phase in the placement of the cells on the die. Chandra, supra. While this approach may reduce some hot-spots and temperature gradients, it does not seem likely that it will eliminate the problem, as for example, a central processing unit ("CPU") core will draw more current than a dynamic random access memory ("DRAM") memory bank.

SUMMARY OF THE INVENTION

The foregoing indicates a need for a semiconductor device, such as a VLSI device, that minimizes or substantially eliminates thermal gradients in the device in order to avoid the various problems associated with these gradients, and a need for a process to make such a device.

Accordingly the present invention provides such a device or devices and processes for manufacturing them that addresses these needs to not only provide advantages over the related art, but also substantially obviate one or more of these and other limitations and disadvantages of semiconductor devices, particularly VLSI devices. The invention also comprises products produced by such processes and processes for minimizing temperature gradients on such devices.

The description that follows sets forth features and advantages of the invention, apparent not only from the description, but also by practicing the invention. The written description, including the abstract of the disclosure and the claims and drawing as filed or as any of the foregoing may be subsequently amended will set forth additional features and advantages of the invention, and particularly point out the objectives and other advantages of the invention, showing how they may be realized and obtained.

To achieve these and other advantages, and in accordance with the purpose of the invention, as embodied and broadly described herein, the invention comprises a semiconductor device such as a VLSI device that minimizes or eliminates hot-spots and/or temperature gradients in the device, such as the die surface by using heat conductor means comprising a plurality of nanotube means positioned on the device to conduct heat away from such hot-spots. The terms "temperature gradient" and "thermal gradient" mean the difference in temperature between the hot-spot and another area or areas on the semiconductor device. The use of such nanotubes takes advantage of their extremely high heat conduction capability along their long axis compared to the metals currently used to remove heat from these devices, thus minimizing or eliminating on-chip temperature gradients. The inventors achieve these advantages by growing nanotubes selectively on the hot-spot areas while using conventional heat conductors for the relatively cooler areas of the chip.

Non-selective growth on the device, i.e., covering the entire surface of the device with nanotubes would have little or no effect in eliminating or minimizing hot-spots or thermal gradients on the device since the rate and degree of cooling the entire surface would be substantially the same, so that the hotter areas would still remain relatively hotter and the other areas relatively cooler even though the temperatures of both would be reduced. Thus selective placement of the nanotubes on the device in combination with placement of conventional heat conductors in complementary areas of the device amounts to a key element in obtaining the advantages of the invention.

Carbon nanotubes comprise strips of graphite sheet rolled into tubes a few nanometers in diameter and up to hundreds of micrometers (microns or "μm") in length. Den et al. U.S. Pat. No. 6,979,244 describes these as sheets of carbon hexagonal meshes parallel to and extending 360° around a vertical axis producing a graphite network of hexagonal rings having the highest heat conductivity of any material (6000 W/mK compared to 400 W/mK for copper).

Bethume et al., U.S. Pat. No. 5,424,054, describes hollow carbon fibers or nanotubes having a cylindrical wall comprising a single layer of carbon atoms and a process for producing such fibers. Other references disclose the production of nanotubes, including Geohegan et al. U.S. Pat. No. 6,923,946; Ma et al. U.S. Pat. No. 6,936,565; Arik et al. U.S. Pat. No. 6,864,571; Dai et al., U.S. Pat. No. 6,346,189; Keesman et al., U.S. Pat. No. RE38,223; Brorson, et al., U.S. Pat. No. 6,887,453; Mo, J. et al. "Integrated Nanotube Cooler for Microelectronic Applications," *Proceedings of the IEEE CPMT Conference on Electronics Components Technology* (*ECTC55*), May 30-Jun. 3, 2005, Orlando, USA, pp. 51-54; Berber, S. et al. "Unusually High Thermal Conductivity of Carbon Nanotubes," *Physical Review Letter*, vol. 84, No. 20, pp. 4613-16, 2000; Fan, S. S. et al., "Self Oriented Regular Arrays of Carbon Nanotubes and Their Field Emission Properties," *Science*, Vol. 283, pp. 512-14, (1999); Ma et al., U.S. Pat. No. 6,936,565; Den et al. U.S. Pat. No. 6,979,244; *Brave New Nanoworld*, p. 3, http://www.ornl.gov/info/ornlreview/rev32_3/brave.htm (Oak Ridge National Laboratory); whereas Den et al.; and *Brave New Nanoworld* (supra) describe methods for making multiwall nanotubes of carbon. Iijima, S., *Nature* 1991, 354, 56; Ajayan, P. M., et al. *Nature* 1992, 358, 23; Ebbesen, T. W., *Nature* 1992, 358, 20; Gao, et al., *J. Phys. Chem. B* 2000, 104, 1227-1234; also describe methods for making nanotubes and Margulis, L. et al., *Journal of Microscopy* 1996, 181, 68-71 identifies helical nanotubes. All of the foregoing references teach nanotubes falling within the scope of the invention.

BRIEF DESCRIPTION OF THE DRAWING

The accompanying drawing, incorporated in and which constitutes a part of this specification, illustrates single and multiple embodiments of the invention, and together with the other parts of the specification, serves to explain the objects, advantages and principles of the invention.

In the drawing the FIGURE comprises a side elevation in cross section of a semiconductor device employing nanotubes for the elimination or minimization of hot-spots on the device.

DETAILED DESCRIPTION OF THE INVENTION

The present invention comprises a semiconductive device having a semiconductor die structure known in the art. The device, and the die in particular, has at least one defined hot-spot area lying in a plane with cooling means comprising a plurality of nanotube means extending in a plane different than the plane of the hot-spot area and outwardly from the plane of the hot-spot area. The term "plane" as used herein includes flat as well as curvilinear planes. In addition to the foregoing, the term "plane" applies to nanotube means lying in a single plane or multiple planes extending substantially from the hot-spot or at a point along the length of the nanotube means. The defined hot-spot area comprises an area identified by thermal analysis that shows a temperature higher than the area or areas surrounding the hot-spot.

The nanotubes can be substantially perpendicular to the plane of the hot-spot, i.e., at substantially a 90° angle, to the plane of the hot-spot, or anywhere from about 70° to about 90°, or about 80° to about 90° to the plane of the hot-spot. The related art shows in this respect that the principle orientation of the nanotubes may not only be straight walled but also include configurations where the wall bends at its upper reaches or may branch, or may take on other configurations. The nanotubes also comprise self oriented (straight up and down) structures with the individual nanotubes being substantially parallel to one another. Fan, S. S. et al., "Self Oriented Regular Arrays of Carbon Nanotubes and Their Field Emission Properties," *Science*, Vol. 283, pp. 512-14, (1999) illustrates nanotube configurations of this type which fall within the scope of the invention. They may also comprise off-vertical arrays or dendritic or forest arrays (Fan et al. FIG. 6), as well as fin projections, or porous two-dimensional arrays, or porous structures as disclosed in FIGS. 2, 4, and 6 of Mo, J. et al. "Integrated Nanotube Cooler for Microelectronic Applications," *Proceedings of the IEEE CPMT Conference on Electronics Components Technology* (*ECTC55*), May 30-Jun. 3, 2005, Orlando, USA, pp. 51-54, and may include bending, and/or intertwining deviations from generally aligned and straight nanotube as described by Arik et al. U.S. Pat. No. 6,864,57. The nanotubes may also comprise fin projections, or porous two-dimensional arrays, or porous structures as disclosed in FIGS. 2, 4, and 6 of Mo, J. et al. (supra) and may include bending, and/or intertwining deviations from generally aligned and straight nanotube orientations as described by Arik et al. U.S. Pat. No. 6,864,571. The present invention includes all of the foregoing configurations.

The invention comprises a plurality of these nanotubes, i.e., clusters somewhere from substantially tens, to hundreds, to thousands, to tens of thousands, or hundreds of thousands or more as distinguished from structures having only 1, or 2 or 3 extending from the surface as disclosed by Dai et al., U.S. Pat. No. 6,346,189 or Den et al. U.S. Pat. No. 6,979,244.

The nanotubes may also comprise helical structures, sometimes referred to as nanosprings or zig-zag structures and are of special interest since they have greater surface area per unit length, whether extended or unextended, as compared to nanotubes that extend substantially in a non-helical or non zig-zag manner. The extra surface area per unit length not only of nanosprings, but also dendritic or forest arrays, fin projections, and porous two-dimensional arrays, or porous structures, all of which fall within the scope of the invention, present configurations that will impact on the convective or conductive cooling properties of the nanotubes.

Den et al. U.S. Pat. No. 6,979,244 describes an arc discharge process for manufacturing these helical carbon nanotubes having an inner diameter of about 4 to about 34 nm and about 1 μm in length as well as a multilayer helix having an inner diameter of about 0.34 nm produced by an arc discharge process. Laser evaporation produces a "rope" shaped carbon nanotube. Gao, et al., *J. Phys. Chem. B* 2000, 104, 1227-1234 also describes these so-called nanotube zig-zag and helical structures and gives methods for manufacturing them. Arik et al. U.S. Pat. No. 6,864,571 discloses these helical structures, referring to them as "nanosprings." Ma et al. U.S. Pat. No. 6,936,565 describes a process for manufacturing these nanosprings, as well as nanotubes comprising physical vapor deposition such as glancing angle deposition or "GLAD."

These nanotubes comprise single wall or multiwall structures up to several centimeters in length as described by Brorson, et al., U.S. Pat. No. 6,887,453 and can have up to about 8 to about 10 or more carbon layers. Den et al. U.S. Pat. No. 6,979,244 also describes these multiwall carbon nanotube structures up to about 1 μm in length, either single wall or multiwall, and in some instances surrounded by amorphous carbon, as well as methods for their manufacture, e.g., by arc discharge, laser evaporation, pyrolysis and plasmas.

Keesman et al., U.S. Pat. No. RE38,223; Ajayan and Iijima, *Nature*, 361, p. 333; Geohegan, U.S. Pat. No. 6,923,946; Arik et al. U.S. Pat. No. 6,864,571; Lieber et al. U.S. Pat. No. 5,897,945; Ma et al. U.S. Pat. No. 6,936,565; and Margulis, L. et al., *Journal of Microscopy* 1996, 181, 68-71 describe variations of these nanotube structures all of which fall within the scope of the invention.

Production of these nanotube means employs processes known in the art, such as the processes described in the foregoing and following references and come within the scope of this invention. The manufacture of carbon nanotube means employs catalysts for the pyrolysis of a carbon containing material, such as for example ethylene or other organic compounds in the presence of a catalyst such as Ni or Co. Den et al. U.S. Pat. No. 6,979,244, citing WO 89/07163 mentions Fe optionally with Mo, Cr, Ce or Mn as suitable catalysts, whereas Dai et al., U.S. Pat. No. 6,346,189 discloses the use of Fe, Mo, Ru, Mo, Co, Ni, Zn, or Ru and preferably the oxides of Fe, Mo, Ru, and Zn, e.g., $Fe_2O_3$ having a particle size of from about 1 μm to about 5 μm as catalysts. Geohegan et al. U.S. Pat. No. 6,923,946 describe Fe, Ni, Co, Rh, Pd or alloys thereof as catalysts, and Mo, J. et al. "Integrated Nanotube Cooler for Microelectronic Applications," *Proceedings of the IEEE CPMT Conference on Electronics Components Technology (ECTC55)*, May 30-Jun. 3, 2005, Orlando, USA, pp. 51-54 employ Fe, Ni, and Co for the catalytic conversion of carbon materials into these nanotubes.

The cooling means comprising the nanotube means is operatively associated with the hot-spot area to decrease any temperature gradient between the hot-spot area and at least one other area on the die defined by a temperature lower than the hot-spot area, which is an area set out by thermal analysis that has a temperature lower than the hot-spot area or areas. These gradients may comprise temperature differences anywhere from about 19° C. to about 45° C., or about 50° C. to about 80° C., or about 25° C. to about 100° C.

"Operatively associated with" also includes those instances where the hot-spot is beneath another layer or layers on the die or enveloped by a packaging material so that heat from the hot-spot is presented to the exterior surface of the other layer or layers or packaging material. The cooling means in that case will be placed on this heated exterior in substantially the same way as they are placed on the hot-spot on the die area.

In one embodiment an adhesion layer secures the catalyst for forming the nanotubes, and as a result the nanotubes as well to the surface of the die. This adhesion layer also helps to join the matrix material to the die. The adhesion layer comprises a boron material or silicon material or metal material, the boron material and the silicon material comprising elemental boron and silicon or compounds of boron and silicon respectively, whereas the metal material comprises both elemental metals as well as metal compounds and alloys and combinations of a boron material or silicon material or metal material.

Examples of adhesion layers comprise Cr or Ta layers. Fan, S. S. et al., "Self Oriented Regular Arrays of Carbon Nanotubes and Their Field Emission Properties," *Science*, Vol. 283, pp. 512-14, (1999), however, describe growing these nanotubes directly on a silicon surface without employing an adhesion layer, this process also falling within the scope of one aspect of the invention.

These cooling means are substantially surrounded by, and in one embodiment, are substantially contiguous with a matrix material on the surface of the device, such as the surface of the die. "Substantially contiguous" in this context means touching the matrix at any point or touching the matrix at a plurality of points, or along the full length of the nanotube means. The matrix comprises a second heat conducting material and is operatively associated with and in a heat conducting relation with the other area on the die defined by a temperature lower than the hot-spot area.

"Operatively associated with" in this context means the matrix material is contiguous at several points or through the whole area of the matrix on the other area of the device such as the die defined by a temperature lower than the hot-spot area, device layers above this area, or packaging material enveloping the device, directly or through an adhesion layer or such layers on such other area on the device, where the adhesion layer comprises a metal material, or boron material, or silicon material, or device components or packaging material that envelops the die. "Metal material" in this context includes elemental metal or metals, metal alloys or metal compounds such as oxides, nitrides, carbides and the like, and "silicon material," and "boron material" have the same meaning as previously given.

The matrix material comprises a layer of the second heat conducting material which in some instances comprises a material that is relatively thick, e.g., anywhere from about 1 μm to about 20 μm, or about 20 μm to about 200 μm, or about 100 μm to about 10000 μm thick, and comprises not only Cu, but also Zr, Nb, Ta, Mo, Zn or Al, and alloys thereof with one another or other elements. Den et al. U.S. Pat. No. 6,979,244 also describes these elements as conductive layers in semiconductor devices. Other materials with lower heat conductivity than copper can also be used in cases where the temperature gradients are too large for the matrix/carbon nanotube combinations to eliminate or minimize temperature gradients as described above. Such materials may comprise, but are not limited to, metal oxides or nitrides, silicon or boron nitrides, and organosilicate glasses.

The heat conductivity of the first heat conducting material (i.e., the material from which the nanotube means is formed) is greater than the heat conductivity of the second heat conducting material (i.e., the material from which the matrix is made). In another aspect of the invention, the distal ends of the nanotubes are substantially free of the matrix material or other material, i.e., the distal ends of the nanotube means are provided with a surface comprising said first heat conducting material to make said distal ends available for direct contact with a medium comprising a cooling medium such as a cooling fluid, i.e., a gas or a liquid, or other cooling medium such as a paste containing aluminum powder and/or flake.

In some instance matrix material might project over the distal ends and requires employing a process to substantially remove the matrix, e.g., chemical-mechanical polishing. In other instances providing a mask over the distal ends during manufacture of the device to substantially prevent other materials from attaching to the surface of the distal ends can have the same effect. Removal of this mask upon the completion of the manufacturing process will make the surface of the distal ends available for direct contact with a medium comprising a heat exchange medium such as a heat exchange fluid. This makes the distal ends of the nanotube means available for direct contact with a medium comprising a heat exchange medium.

The nanotube means in some embodiments are substantially parallel to one another; linear or helical; lie in a plane perpendicular to the plane of the hot spot; comprise carbon; or the nanotubes may comprise single wall or multi-wall nanotubes; or the first heat conducting material comprises carbon and the second heat conducting material comprises a metal; or the device comprises a VLSI device. In another embodiment, the device may be characterized not only by any one of the foregoing features, but also any combination of these features.

The FIGURE illustrates one aspect of the invention, and shows a side elevation in section of a semiconducting device 10 comprising part of a VLSI device that comprises silicon die 12 coated with an adhesion layer 14 comprising either Cr or Ta, and a catalyst 16 comprising Ni or Co for producing carbon nanotubes applied selectively to high temperature regions or hot-spots 26 extending to and forming hot-spot areas on the surface of die 12. Carbon nanotube clusters 20 grown on the catalyst extend substantially perpendicular from the die 12 with distal ends in an open region above the device 10. The distal ends of carbon nanotubes 20 are substantially free of extraneous materials and comprise carbon. A matrix material comprising copper layer 18 substantially surrounds and is substantially contiguous with the outer regions of the sidewalls of nanotube clusters 20. Interconnect layer 22 comprises a conventional interconnect material known in the art and connects silicon die 12 to a ball grid array socketing system 24 known in the art.

The high temperature regions 26 that form the hot-spot areas are surrounded by regions at a lower temperature when the device is in use. This initially produces a temperature gradient between the hot-spot areas and the other areas. The carbon nanotubes 20 cool the hot-spot areas at a faster rate than copper matrix 18 cools the other areas because of the higher heat conductivity of the nanotube clusters 20 compared to the copper matrix 18, thereby substantially minimizing or eliminating any temperature gradient that develops on the surface of device 10.

When in use, the device 10 has a region above it comprising a heat exchange medium such as a heat exchange fluid in heat exchange relation with the distal ends of the carbon nanotube clusters 20. The heat exchange fluid can comprise air, nitrogen, a rare gas, a refrigerant gas, e.g., a fluorochloro carbon, or fluorocarbon known in the art, or other gas, or a liquid such as water or an organic liquid, e.g., a ketone, ether, ester, or alcohol also known in the art. In one embodiment, the heat exchange fluid is circulated over the distal ends of nanotubes 20, passed to a heat exchanger, and recirculated to the device 10. A once through system can be employed comprising passing a heat exchange fluid such as air or nitrogen over the distal ends of nanotubes 20 and exhausting it away from the device 10.

EXAMPLE

A semiconducting device such as a VLSI device is constructed in a manner well known in the art. The hot-spot areas or pattern of the on-die circuits are identified as well as the other areas on the die having a temperature lower than the hot spot areas, using the method and apparatus described by Hamann, H. F. et al. "Power Distribution Measurements of the Dual Core PowerPC™970 MP Microprocessor," ISSCC Dig. Tech Papers, p. 534, February 2006.

A lithographic mask corresponding to the hot-spot regions is fabricated followed by deposition of a Cr or Ta adhesion layer for the subsequent catalyst layer. Using the lithographic mask and standard lithographic techniques, a Ni, or Co, or Fe catalyst layer for nanotube growth is patterned over the adhesion layer to correspond to the hot-spot regions. Fan, S. S. et al., "Self Oriented Regular Arrays of Carbon Nanotubes and Their Field Emission Properties," *Science*, Vol. 283, pp. 512-14, (1999) and Mo, J. et al. "Integrated Nanotube Cooler for Microelectronic Applications," *Proceedings of the IEEE CPMT Conference on Electronics Components Technology (ECTC55)*, May 30-Jun. 3, 2005, Orlando, USA, pp. 51-54 describe processes using masks. The substrate is then inserted into a carbon nanotube growth chamber to produce carbon nanotube clusters on the catalyst patterns using growth conditions known in the art that promote growth of vertically aligned, i.e., perpendicular to the substrate, carbon nanotubes.

A layer of copper slightly greater in thickness than the height of the carbon nanotube clusters is then deposited over the entire structure by means of electro deposition or other methods well known in the art, and the copper layer subjected to chemical mechanical polishing, also well known in the art, to expose the distal ends of the nanotube clusters sufficiently to allow the carbon surfaces of the clusters to be substantially in direct heat exchange contact with a medium comprising a heat exchange fluid or other heat exchange medium.

Throughout this specification, the inventors have set out equivalents, such as equivalent elements, materials, compounds, compositions, conditions, processes, structures and the like, and even though set out individually, also include combinations of these equivalents such as the two component, three component, or four component combinations.

Additionally, the various numerical ranges describing the invention as set forth throughout the specification also include any combination of the lower ends of the ranges with the higher ends of the ranges, and any single numerical value within a range, or any single numerical value within a range that will reduce the scope of the lower limits of the range or the scope of the higher limits of the range, and ranges falling within any of these ranges.

The terms "about," or "substantial," or "substantially" as applied to any parameters herein, such as a numerical value, including values used to describe numerical ranges, means slight variations in the parameter, or that which is largely or for the most part entirely specified. The inventors also employ the terms "about," "substantial," and "substantially," in the same way as a person with ordinary skill in the art would understand them or employ them. In another embodiment, the terms "about," "substantial," or "substantially," when employed to define numerical parameters include, e.g., a variation up to five per-cent, up to ten per-cent, or up to 15 per-cent, or somewhat higher or lower than the upper limit of five per-cent, ten per-cent, or 15 per-cent. The term "up to" that defines numerical parameters means zero or a miniscule number, e.g. 0.001.

All scientific journal articles and other articles as well as patents that this written description mentions including the references additionally cited in such scientific journal articles and other articles, and such patents, are incorporated herein by reference in their entirety.

Although the inventors have described their invention by reference to some embodiments, they do not intend that such embodiments should limit their invention, but that other embodiments encompassed by the doctrine of equivalents are intended to be included as falling within the broad scope and spirit of the foregoing written description, the Abstract of the Invention, the drawing, and the claims.

We claim as our invention:

1. A process for providing cooling means on the surface of a semiconducting device having a die comprising:
   (a) defining by thermal analysis, at least one hot-spot area lying in a plane on said die;
   (b) defining by thermal analysis, at least one other area on said die having a temperature lower than said hot-spot area;
   (c) fabricating a mask corresponding to said hot-spot area;
   (d) selectively applying to the surface of said die by means of said mask, a catalyst to define a catalyst area corresponding to said hot-spot area and thereby produce a semiconductive device having a die with a selectively catalyzed surface; said catalyst selected to promote the growth of a plurality of heat conducting nanotube means;
   (e) growing said nanotube means from a first heat conducting material and on said selectively catalyzed area to extend in a different plane than the plane of said hot-spot area and outwardly form the plane of said hot-spot area, said nanotube means being operatively associated with said hot-spot area to decrease any temperature gradient between said hot-spot area and said area on said device having a temperature lower than said hot-spot area;
   (f) depositing a second heat conducting material on the surface of said die to form a matrix to surround said nanotube means, said second heat conducting material extending to and operatively associated with said other area on said die having a temperature lower than said hot-spot area to conduct heat away from said other area, said nanotube means made from said first heat conducting material having a higher heat conductivity than said matrix made from second heat conducting material;
   (g) sufficiently removing any of said second heat conducting material that extends above the distal ends of said nanotube means to make said distal ends available for direct contact with a medium comprising a heat exchange medium.

2. The process of claim 1 wherein prior to selectively applying said catalyst layer to the surface of said die, the step of applying a metal adhesion layer to the surface of said die.

3. The process of claim 1 wherein said nanotube means substantially:
   (a) are parallel to one another;
   (b) are linear or helical;
   (c) are perpendicular to the plane of said hot spot; and
   (d) comprise carbon;
   (e) said heat exchange medium comprises a heat exchange fluid; and
   (f) said nanotube comprises single wall or multi-wall nanotube.

4. The process of claim 3 comprising forming said nanotube means from a material comprising carbon and said matrix from a material comprising a metal.

5. The process of claim 3 wherein said semiconducting device comprises a VLSI device.

6. A process for cooling the surface of a semiconducting device having a die comprising:
   (a) defining by thermal analysis, at least one hot-spot area lying in a plane on said die;
   (b) defining by thermal analysis, at least one other area on said die having a temperature lower than said hot-spot area;
   (c) fabricating a mask corresponding to said hot-spot area;
   (d) selectively applying to the surface of said die by means of said mask, a catalyst to define a catalyst area corresponding to said hot-spot and thereby produce a semiconductive device having a die with a selectively catalyzed surface; said catalyst selected to promote the growth of a plurality of heat conducting nanotube means;
   (e) growing said nanotube means from a first heat conducting material and on said selectively catalyzed area to extend in a different plane than the plane of said hot-spot area and outwardly form the plane of said hot-spot area, said nanotube means being operatively associated with said hot-spot area to decrease any temperature gradient between said hot-spot area and said area on said device having a temperature lower than said hot-spot area;
   (f) depositing a second heat conducting material on the surface of said die to form a matrix to substantially surround said nanotube means, said second heat conducting material extending to and operatively associated with said other area on said die having a temperature lower than said hot-spot area to conduct heat away from said other area, said nanotube means made of said first heat conducting material having a higher heat conductivity than said matrix formed from said second heat conducting material;
   (g) sufficiently removing any of said second heat conducting material that extends above the distal ends of said nanotube means to make said distal ends available for direct contact with a medium comprising a heat exchange medium;
   (h) contacting said distal ends with said medium comprising a heat exchange medium, said heat exchange medium being at a temperature lower than the temperature of said distal ends.

7. The process of claim 6 wherein said nanotube means substantially:
   (a) are parallel to one another;
   (b) are linear or helical;
   (c) are perpendicular to the plane of said hot spot; and
   (d) comprise carbon;
   (e) said heat exchange medium comprises a heat exchange fluid; and
   (f) said nanotubes comprise single wall or multi-wall nanotubes.

8. The process of claim 7 wherein said semiconducting device comprises a VLSI device.

* * * * *